United States Patent [19]

Sagawa et al.

[11] Patent Number: 5,715,532
[45] Date of Patent: Feb. 3, 1998

[54] FREQUENCY CONVERTER APPARATUS WITH DISTORTION COMPENSATING CIRCUIT

[75] Inventors: Morikazu Sagawa; Keiichirou Kuwaduru; Kazuaki Takahashi, all of Tokyo; Yoshikazu Mori, Kawasaki, all of Japan

[73] Assignee: Matsushita Electric Industrial, Co., Osaka, Japan

[21] Appl. No.: 592,864

[22] Filed: Jan. 24, 1996

[30] Foreign Application Priority Data

Jan. 24, 1995 [JP] Japan .................................. 7-009090
Jun. 23, 1995 [JP] Japan .................................. 7-157517

[51] Int. Cl.$^6$ .................................. H04B 1/26; H03D 7/14
[52] U.S. Cl. .................................. 455/333; 455/317
[58] Field of Search .................................. 455/333, 326, 455/317, 313, 314, 318, 319, 332; 327/113, 359, 356, 355

[56] References Cited

U.S. PATENT DOCUMENTS

| | | | |
|---|---|---|---|
| 4,268,916 | 5/1981 | Kusakabe .................. | 455/333 |
| 4,344,188 | 8/1982 | Tanabe et al. . | |
| 4,416,024 | 11/1983 | Ugari et al. . | |
| 4,590,616 | 5/1986 | Van Glabbeek .................. | 455/333 |
| 5,136,254 | 8/1992 | Kuwahara . | |
| 5,379,457 | 1/1995 | Nguyen .................. | 455/333 |
| 5,448,772 | 9/1995 | Grandfield .................. | 455/326 |
| 5,551,074 | 8/1996 | Vice .................. | 455/333 |

FOREIGN PATENT DOCUMENTS

| | | | |
|---|---|---|---|
| 54-138319 | 10/1979 | Japan .................. | 455/333 |
| 2243965 | 11/1991 | United Kingdom .................. | 455/333 |

OTHER PUBLICATIONS

"Low–Voltage Techinques For High–Frequency Si–Bipolar Circuits" by T. Tsukahara et al; MWE '93 Microwave Workshop Digest; pp., 357–360.

*Primary Examiner*—Reinhard J. Eisenzopf
*Assistant Examiner*—Lester G. Kincaid
*Attorney, Agent, or Firm*—Pollock, Vande Sande & Priddy

[57] ABSTRACT

A frequency converter may be employed in communication equipment such as a portable telephone. The frequency converter includes a differential pair consisting of first and second transistors, a current bypass circuit consisting of third and fourth transistors, and a distortion compensating circuit consisting of fifth and sixth transistors. The distortion compensating circuit decreases an emitter-to-base voltage of the sixth transistor when an emitter current of the first transistor is increased, while it increases an emitter-to-base voltage of the fifth transistor when an emitter current of the second transistor is decreased, non-linearts components of the emitter-to-base voltages of the first and second transistors caused by variations of RF (radio-frequency) signals inputted to the first and second transistors are called decreasing distortion of an output signal of the frequency converter caused by the difference in operating point between the first and second transistors.

18 Claims, 9 Drawing Sheets

FREQUENCY CONVERTER APPARATUS WITH DISTORTION COMPENSATING CIRCUIT

BACKGROUND OF THE INVENTION

1. Technical Field

The present invention relates generally to a frequency converter for use in communication equipment such as a portable telephone, and more particularly to a frequency converter having a distortion compensating circuit.

2. Background Art

In recent years, there is an increasing need for frequency converters operable on a decreased supply voltage in communication equipment such as portable telephones. A frequency converter has been proposed wherein emitters of a plurality of transistors are coupled in parallel and RF (radio-frequency) and Lo (local-oscillator) signals are applied to bases of the transistors to provide a composite output mixing the RF and Lo signals through collectors.

Figure 10:
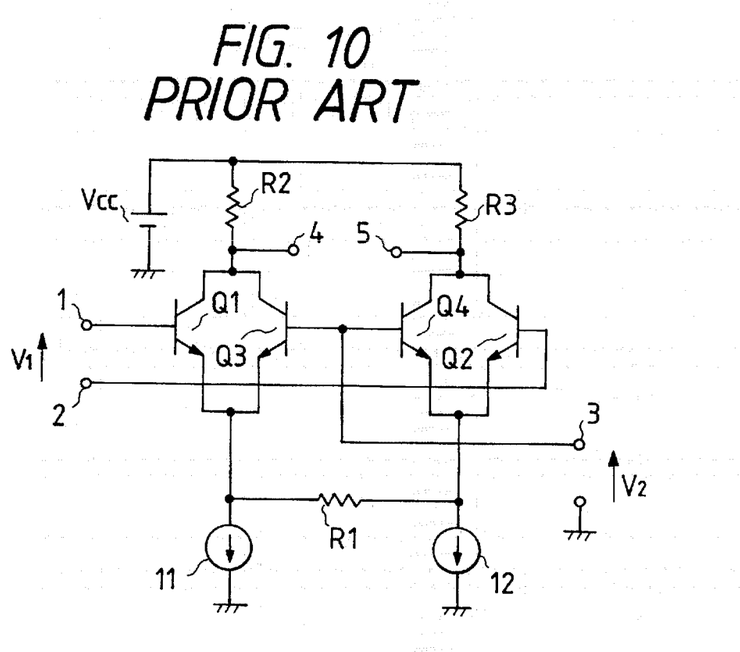
FIG. 10 is a circuit diagram which shows a conventional frequency converter.

FIG. 10 shows a conventional frequency converter designed to provide a difference frequency.

The shown frequency converter includes transistors Q1 to Q4, current sources I1 and I2, an emitter coupling resistor R1, output load resistors R2 and R3, and a voltage source Vcc. RF signals V1 are applied to input terminals 1 and 2. An Lo signal V2 is applied to an input terminal 3. Note that a bias circuit for providing bias signals to the bases of the transistors is omitted for the brevity of illustration.

In operation, the transistors Q1 and Q2 are connected through the emitter coupling resistor R1 to constitute a differential pair to which the RF signals are inputted from the input terminals 1 and 2. The transistors Q3 and Q4 function as current-bypassing transistors connected in parallel to the transistors Q1 and Q2, into which the Lo signal V2 is inputted from the input terminal 3. A frequency conversion operation is achieved by inputting the Lo signal V2 to the bases of the current bypass transistors Q3 and Q4 to modulate the transconductance of the differential pair consisting of the transistors Q1 and Q2 into which the RF signals V1 are inputted. Composite outputs from the transistors Q1 to Q4 are converted by the resistors R2 and R3 into voltages and then appear at the output terminals 4 and 5 as IF (intermediate-frequency) signals. The IF signals include not only two input frequencies, but also summation and difference frequency components of the two input frequencies and distortion frequency components. An external filter is thus used to extract only a desired frequency, for example, a difference frequency.

The above conventional frequency converter can operate on a lower voltage of the order of Vcc=2V, but encounters the following drawbacks. Operating points of the transistors Q1 and Q2 constituting the differential pair will be different from each other as the amplitude of the RF signal V1 is increased, thereby causing distortion to be produced in an output signal. Additionally, since IF signal output components from the transistors Q3 and Q4 into which the Lo signal V2 is inputted are much smaller than those from the transistors Q1 and Q2 into which the RF signals V1 are inputted, composite outputs mixing the IF signal output components from the transistors Q1 and Q3 and from the transistors Q2 and Q4 become substantially equal in level to the IF signal output components from the transistors Q1 and Q2 so that an increase in output signal level cannot be achieved.

SUMMARY OF THE INVENTION

It is therefore a principal object of the present invention to avoid the disadvantages of the prior art.

It is another object of the present invention to provide a frequency converter which operates with a decreased power consumption and provides an output signal at a lower distortion level with a high gain.

According to one aspect of the present invention, there is provided a frequency converter apparatus which comprises a differential pair including first and second transistors into which a first signal is inputted, a current bypass circuit including third and fourth transistors, into which a second signal is inputted, bases of the third and fourth transistors being connected to each other, an emitter of the third transistor being connected to an emitter of the first transistor, an emitter of the fourth transistor being connected to an emitter of the second transistor, an output load circuit disposed so as to connect a power source to the differential pair and the current bypass circuit, a distortion compensating circuit including fifth and sixth transistors, a collector of the fifth transistor and a base of the sixth transistor being connected to a junction of the emitters of the first and third transistors, a base of the fifth transistor and a collector of the sixth transistor being connected to a junction of the emitters of the second and fourth transistors, a current source circuit connected to emitters of the fifth and sixth transistors, and a resistor disposed between the emitters of the fifth and sixth transistors.

In the preferred mode of the invention, the third and fourth transistors are smaller in size than the first and second transistors.

Resistors are provided which are connected to the emitters of the third and fourth transistors, respectively.

The output load circuit includes a load resistor interposed between the power source and at least one of the collectors of the first, second, third, and fourth transistors. A signal output terminal is further provided which is disposed between the load resistor and the at least one of the collectors of the first, second, third, and fourth transistors.

The output load circuit may alternatively include first and second load resistors interposed between the power source and the collectors of the first and third transistors and between the power source and the collectors of the second and fourth transistors, respectively. Signal output terminals are provided which are disposed between the first load resistor and the collectors of the first and third transistors and between the second load resistor and the collectors of the second and fourth transistors.

The output load circuit may alternatively include a transformer composed of a primary and a secondary. The primary is supplied with output components of output signals from at least one of the differential pair including the first and second transistors and the current bypass circuit including the third and fourth transistors, having opposite phases to each other and also supplied with power from the power source through a central portion of the primary for providing an output from the secondary.

The output load circuit may alternatively include a transformer composed of a primary and a secondary. The primary is supplied with a composite output mixing collector outputs from the first and third transistors and a composite output mixing collector outputs from the second and fourth transistors and also supplied with power from the power source through a central portion of the primary for providing an output from the secondary.

The output load circuit may alternatively include first and second pnp transistors whose emitters are connected to the power source. A base and a collector of the first pnp transistor are coupled to each other. The base of the first pnp transistor is coupled to a base of the second pnp transistor. The collectors of the first and second pnp transistors are supplied with collector outputs from at least one of the differential pair including the first and second transistors and the current bypass circuit including the third and fourth transistors. A signal output terminal is provided which is connected to a collector of the second pnp transistor.

The output load circuit may alternatively include first and second pnp transistors whose emitters are connected to the power source. A base and a collector of the first pnp transistor are coupled to each other. The base of the first pnp transistor is coupled to a base of the second pnp transistor. The collector of the first pnp transistor is supplied with a composite output mixing collector outputs from the first and third transistors. The collector of the second pnp transistor is supplied with a composite output mixing collector outputs from the second and fourth transistors. A signal output terminal is provided which is connected to the collector of the second pnp transistor.

The current source circuit includes a seventh transistor and a resistor. The seventh transistor is connected at a base to a current source circuit including a band-gap circuit, at a collector to the distortion compensating circuit, and at an emitter to ground through the resistor of the current source circuit.

A first input terminal is provided which is connected to the emitter of at least one of the first and second transistors for inputting the first signal thereinto and a second input terminal connected to the bases of the third and fourth transistors for inputting the second signal thereinto. The first input terminal may be connected to the emitter of the first transistor and also connected to the emitter of the second transistor through the sixth transistor of the distortion compensating circuit.

A third input terminal is provided for inputting a third signal having an opposite phase to that of the first signal into the emitter of the second transistor.

The output load circuit may alternatively include first and second load resistors. The first load resistor connects between the power source and the collectors of the first and forth transistors. The second load resistor connects between the power source and the collectors of the second and third transistors. An output signal terminal is provided which is connected to a junction of the collectors of the second and third transistors. The output signal terminal is also disposed between the second load resistor and the collector of the second transistor.

According to another aspect of the present invention, there is provided a frequency converter apparatus which comprises a first frequency converter circuit, a second frequency converter circuit, and an output load circuit. Each of the first and second frequency converter circuits includes (1) a differential pair including first and second transistors into which a first signal is inputted, (2) a current bypass circuit including third and fourth transistors, into which a second signal is inputted, bases of the third and fourth transistors being connected to each other, an emitter of the third transistor being connected to an emitter of the first transistor, an emitter of the fourth transistor being connected to an emitter of the second transistor, (3) a distortion compensating circuit including fifth and sixth transistors, a collector of the fifth transistor and a base of the sixth transistor being connected to a junction of the emitters of the first and third transistors, a base of the fifth transistor and a collector of the sixth transistor being connected to a junction of the emitters of the second and fourth transistors; (4) a current source circuit connected to emitters of the fifth and sixth transistors, and (5) a resistor disposed between the emitters of the fifth and sixth transistors. The first and second frequency converter circuits are connected so as to mix same phase output signal components provided thereby. The output load circuit is disposed so as to connect a power source to the differential pair and the current bypass circuit of each of the first and second frequency converter circuits.

In the preferred mode of the invention, the third and fourth transistors of at least one of the first and second frequency converter circuits are smaller in size than the first and second transistors of the at least one of the first and second frequency converter circuits.

Resistors are provided which are connected to the emitters of the third and fourth transistors of each of the first and second frequency converter circuits, respectively.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
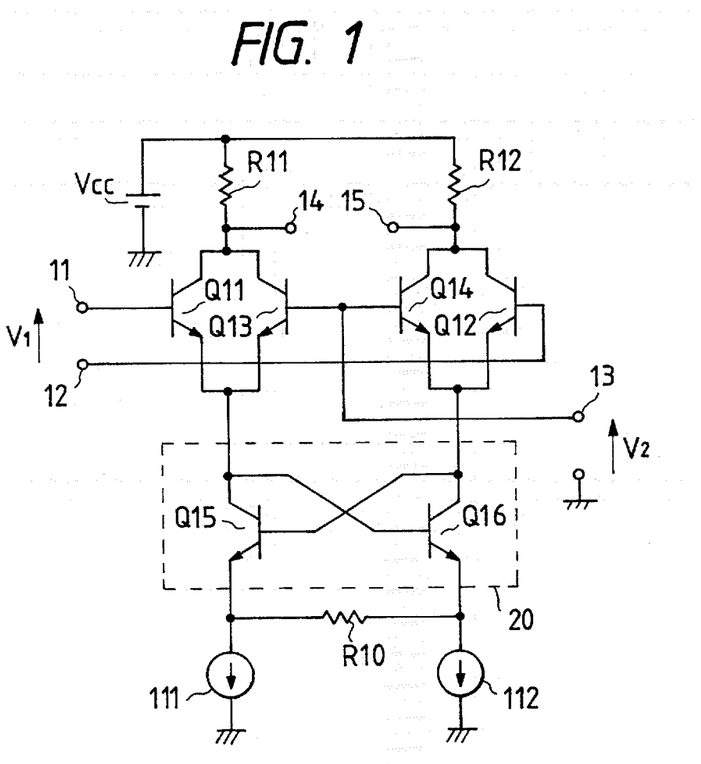
FIG. 1 is a circuit diagram which shows a frequency converter according to the first embodiment of the invention.

Referring now to the drawings, particularly to FIG. 1, there is shown a frequency converter according to the present invention.

The frequency converter generally includes input terminals 11 and 12 into which RF (radio-frequency) signals V1 are inputted, an input terminal 13 into which an Lo (local-oscillator) signal V2 is inputted, output terminals 14 and 15 from which IF (intermediate-frequency) signals are outputted, a distortion compensating circuit 20 consisting of transistors Q15 and Q16, transistors Q11 and Q12 constituting a differential pair, transistors Q13 and Q14 constituting a current bypass circuit, current sources I11 and I12, an emitter-coupling resistor R10, output load resistors R11 and R12, and a voltage source Vcc. The frequency converter is designed to provide a difference frequency (i.e., the IF signal) representing the difference between the RF signal and the Lo signal. Note that a bias circuit for providing bias to each base of the transistors is omitted for the sake of simplicity of illustration, but a circuit including a band-gap circuit and a current mirror may be used.

In operation, the RF signals V1 are inputted to the input terminals 11 and 12. The Lo signal V2 is input to the input terminal 13 and then supplied to the bases of the current bypass transistors Q13 and Q14 to modulate the transconductance of the differential pair consisting of the transistors Q11 and Q12 for achieving a frequency conversion operation. Output signals from the differential pair are converted by the load resistors R11 and R12 into voltages appearing at the output terminals 14 and 15 as the IF signals, respectively. The IF signals include not only difference frequency components, but also summation frequency components of two input frequencies and a distortion frequency component. An external filter (not shown) may thus be used to extract only a desired frequency, for example, a difference frequency.

The frequency converter of this embodiment, as discussed above, includes the distortion compensating circuit 20 which functionally serves to reduce distortion of an output signal caused by the difference in operating point between the transistors Q11 and Q12 even if the amplitude of the RF signals are increased. The distortion compensating circuit 20 consists of the transistors Q15 and Q16. The transistor Q15 has a collector connected to a junction of emitters of the transistors Q11 and Q13 and a base connected to a collector of the transistor Q16. Similarly, the transistor Q16 has the collector connected to a junction of emitters of the transistors Q12 and Q14 and a base connected to the collector of the transistor Q15. Emitters of the transistors Q15 and Q16 are connected to the current sources I11 and I12, respectively, and coupled together through the emitter-coupling resistor R10.

Emitter-to-base voltages $V_{BE}$ of the transistors Q11 and Q12 are usually changed in non-linear fashion according to variations of the RF signals which are 180° out of phase with each other. The activity of the distortion compensating circuit 20, however, serves to decrease an emitter-to-base voltage $V_{BE}$ of the transistor Q16 when an emitter current of the transistor Q11 is increased, while it increases an emitter-to-base voltage $V_{BE}$ of the transistor Q15 when an emitter current of the transistor Q12 is decreased so that the non-linearity components of the emitter-to-base voltages $V_{BE}$ of the transistors Q11 and Q12 are canceled to decrease the distortion caused by the difference in operating point between the transistors Q11 and Q12.

Additionally, the distortion compensating circuit 20 also functions to increase transfer conductances of the RF signals V1 as compared with a conventional frequency converter so that a high conversion gain is obtained.

While, in the above embodiment, the load resistors R11 and R12 are connected to junctions of the collectors of the transistors Q11 and Q13 and the collectors of the transistors Q12 and Q14, resistors may alternatively be connected directly to the collectors of the transistors Q11 and Q12 or the transistors Q13 and Q14.

Figure 2:
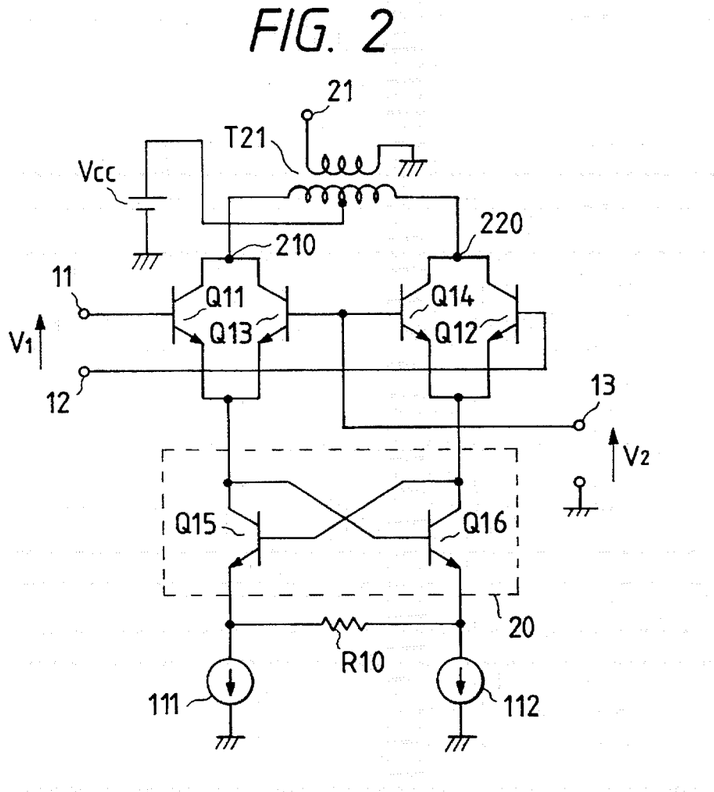
FIG. 2 is a circuit diagram which shows a frequency converter according to the second embodiment of the invention.

FIG. 2 shows a second embodiment of the frequency converter of the invention which is different from the above first embodiment only in that a transformer T21 is provided to mix the IF signals which appear at a junction 210 of the collectors of the transistors Q11 and Q13 and a junction 220 of the collectors of the transistors Q12 and Q14 and which are 180° out of phase with each other (hereinafter, referred to as reverse phase IF signals). Other arrangements are identical, and explanation thereof in detail will be omitted here.

The transformer T21, as clearly shown in the drawing, includes primary and secondary windings. The primary winding is connected at both ends to the junctions 210 and 220 and also connected at its central portion to the voltage source Vcc. With these arrangements, the transformer T21 combines the reverse phase IF signals into a single composite signal having a signal level twice those of the reverse IF signals and cancels Lo signal components appearing at the junctions 210 and 220, having the same phase. The composite signal is then outputted from an output terminal 21 connected to the secondary winding. This results in an increased conversion gain and eliminates leakage of the Lo signal that is an unwanted output. The transformer T21 is small in dc loss, and, thus, a dc voltage drop of a transformer load is small, thereby allowing a voltage level of the voltage source Vcc to be lowered as compared with the first embodiment using the output load resistors R11 and R12.

While, in the second embodiment, the transformer T21 mixes a composite signal of collector outputs from the differential pair transistors Q11 and Q12 and a composite signal of collector outputs from the current bypass transistors Q13 and Q14, it may mix the collector outputs only from the differential pair transistors Q11 and Q12 or from the current bypass transistors Q13 and Q14.

Figure 3:
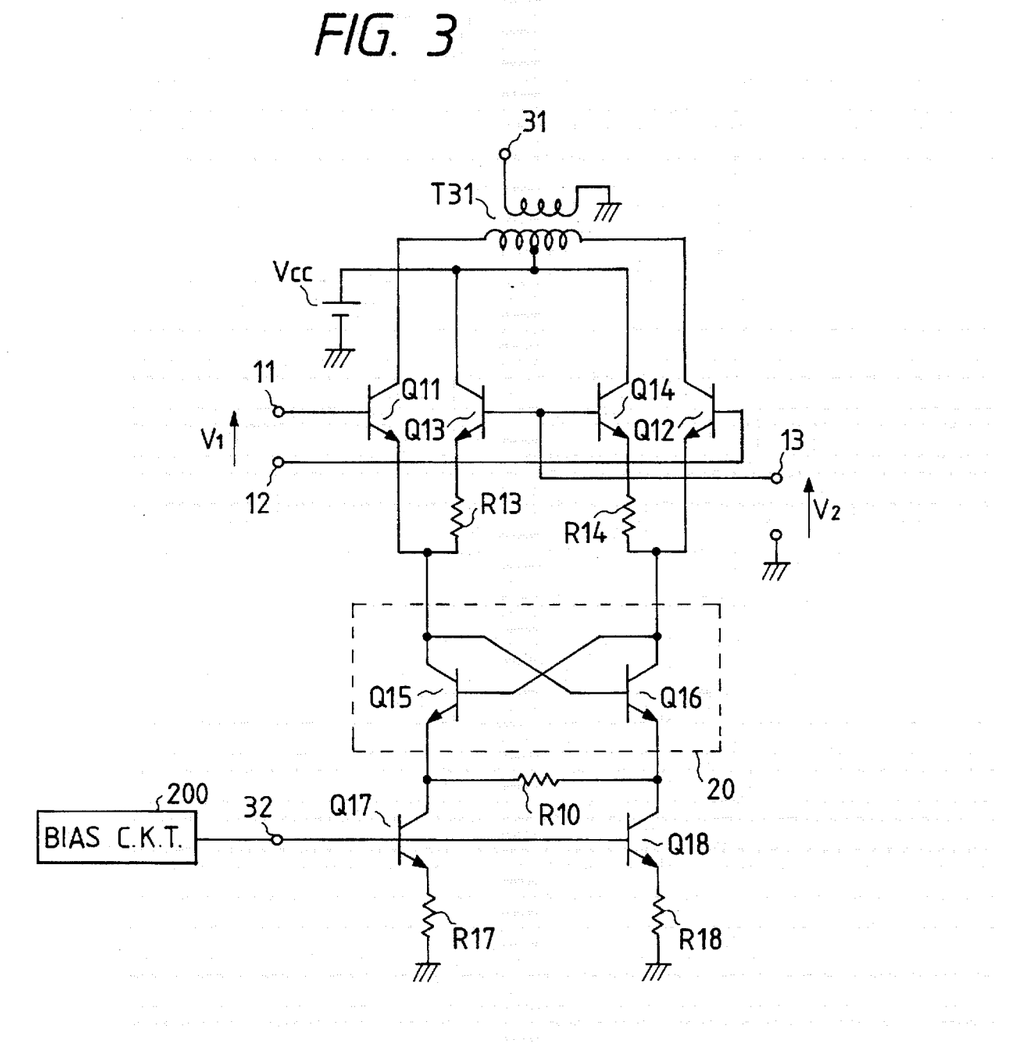
FIG. 3 is a circuit diagram which shows a frequency converter according to the third embodiment of the invention.

FIG. 3 shows a third embodiment of the frequency converter of the invention which is different from the above second embodiment in that distortion compensation adjusting resistors R13 and R14, a transformer T31 mixing the reverse phase IF signals outputted from the collectors of the differential pair transistors Q11 and Q12, and a constant current source consisting of transistors Q17 and Q18 and resistors R17 and R18 are provided.

The distortion compensation adjusting resistors R13 and R14 are, as clearly shown in the drawing, connected to the emitters of the transistors Q13 and Q14, respectively. The transistors Q17 and Q18 are connected at collectors to the emitters of the transistors Q15 and Q16 of the distortion compensating circuit 20, respectively, and also connected at emitters to ground through the resistors R17 and R18, respectively. A biasing circuit 200 composed of a band-gap circuit and a current mirror provides bias signals to bases of the transistors Q17 and Q18 through a bias terminal 32. The transformer T31, similar to the transformer T21, includes primary and secondary windings. The primary winding is connected at its ends to the collectors of the transistors Q11 and Q12. The voltage source Vcc supplies the voltage to a central portion of the primary winding. The secondary winding provides through an IF signal output terminal 31 a composite signal mixing the reverse phase outputs from the transistors Q11 and Q12.

The operations of the distortion compensating circuit 20 and the transformer T31 are the same as those of the second embodiment, and explanation thereof in detail will be omitted here.

The distortion compensation adjusting resistors R13 and R14 serve to alleviate the influence of the current bypass transistors Q13 and Q14 on distortion generation caused by the difference in operating point between the differential pair transistors Q11 and Q12 and achieves a fine adjustment of distortion compensation by the distortion compensating circuit 20. The activities of the distortion compensation adjusting resistors R13 and R14 decrease IF signal outputs from the current bypass transistors Q13 and Q14, while outputs from the differential pair transistors Q11 and Q12 are changed dependent upon resistor values of the resistors R13 and R14. Thus, if the outputs from the differential pair transistors Q11 and Q12 are simply mixed, it becomes difficult to maximize the effect of mixing them. For this reason, the outputs from the differential pair transistors Q11 and Q12 are, similar to the second embodiment, combined in a reverse phase relation through the transformer T31 into a composite signal having an output level of twice those of the outputs from the transistors Q11 and Q12. This operation of the transformer T31 also cancels the Lo signal components having the same phase.

Outputs are not extracted from the current bypass transistors Q13 and Q14, and, thus, it is not necessary to connect resistors to them, thereby allowing the collectors of the transistors Q13 and Q14 to be connected directly to the voltage source Vcc.

As an alternative to the use of the distortion compensation adjusting resistors R13 and R14 connected to the emitters of the current bypass transistors Q13 and Q14, it is possible to use as the transistors Q13 and Q14 transistors having smaller emitters in size than the differential circuit transistors Q11 and Q12.

Figure 4:
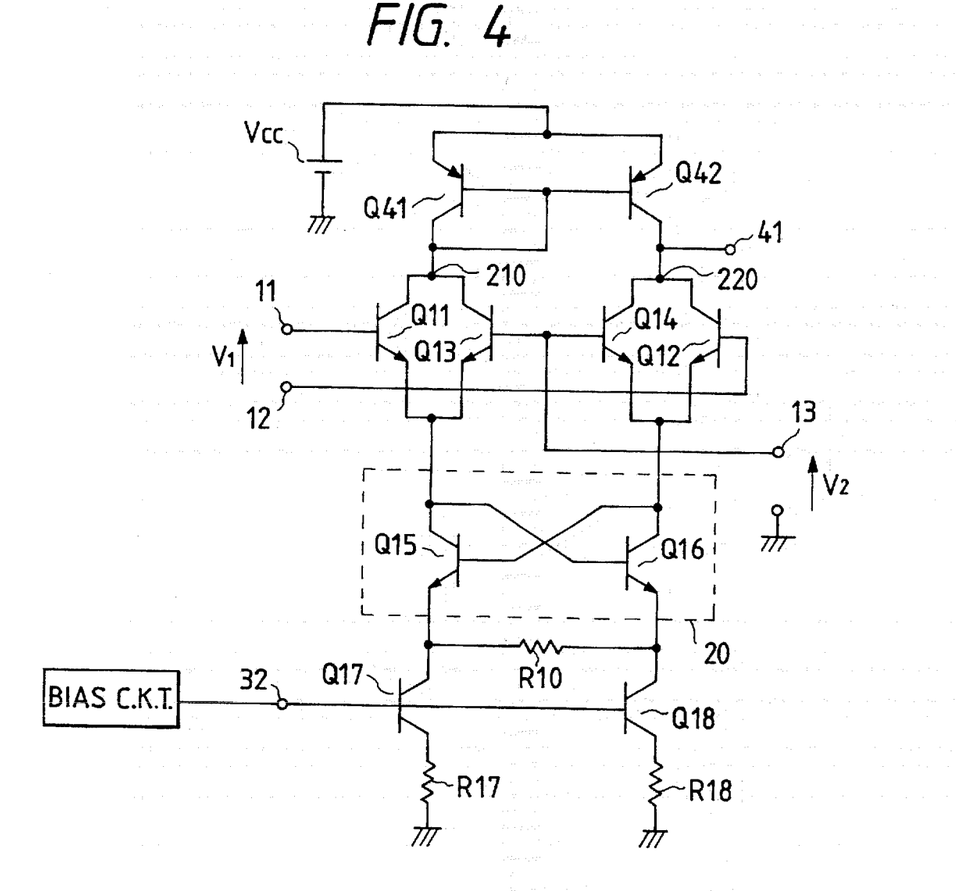
FIG. 4 is a circuit diagram which shows a frequency converter according to the fourth embodiment of the invention.

FIG. 4 shows a fourth embodiment of the frequency converter of the invention which is different from the second embodiment in that an active load circuit including a pair of pnp transistors Q41 and Q42 and a constant current source including transistors Q17 and Q18 and resistors R17 and R18 are provided. The constant current source is the same as that of the third embodiment.

The pnp transistors Q41 and Q42 of the active load circuit are, as can be seen in the drawing, connected at collectors to the junctions 210 and 220 of collectors of the transistors Q11 and Q13 and collectors of the transistors Q12 and Q14, respectively, and also connected together base to base. The base of the transistor Q41 is also connected to the collector thereof. The voltage from the voltage source Vcc is supplied to emitters of the transistors Q41 and Q42 The IF signal is extracted from the IF signal output terminal 41.

The active load circuit are functionally the same as the transformers T21 and T31 and mixes currents flowing through the differential pair transistors Q11 and Q12 in a reverse phase relation.

While, in this embodiment, the pnp transistors Q41 and Q42 are connected to the junctions 210 and 220 of collectors of the transistors Q11 and Q13 and collectors of the transistors Q12 and Q14, they may alternatively be connected directly to the collectors of the transistors Q11 and Q12 or the transistors Q13 and Q14, respectively.

Figure 5:
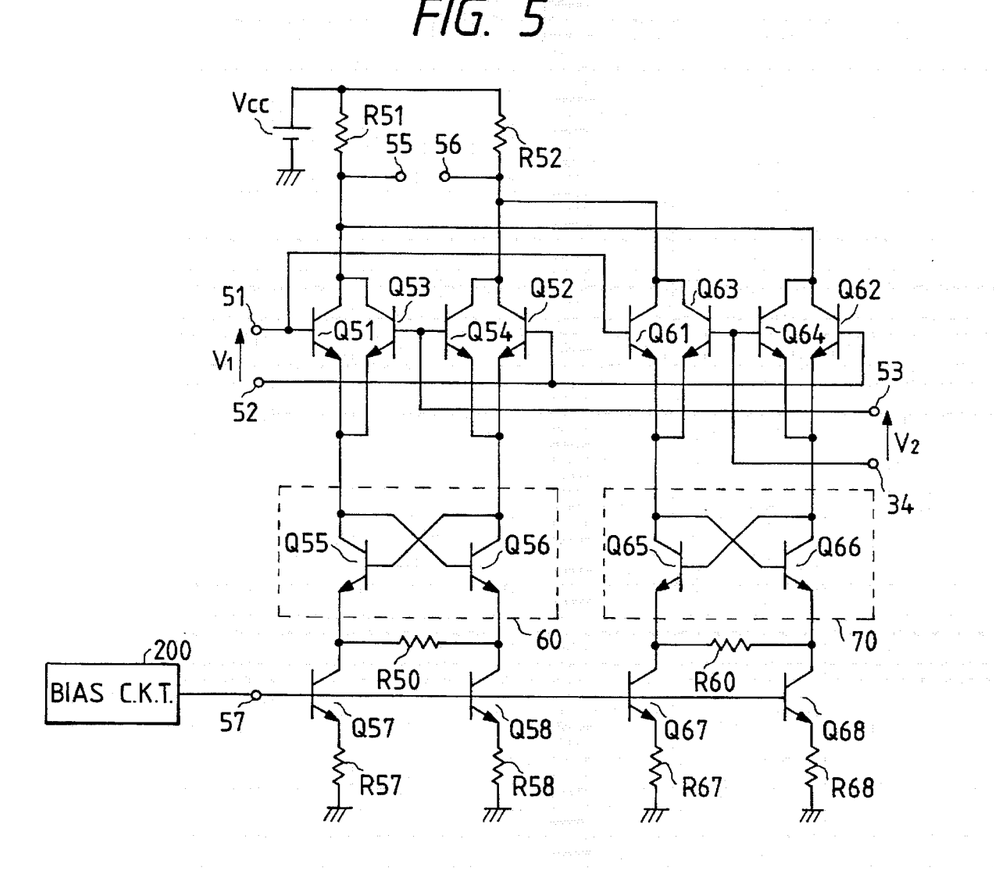
FIG. 5 is a circuit diagram which shows a frequency converter according to the fifth embodiment of the invention.

FIG. 5 shows a fifth embodiment of the frequency converter of the invention which includes two frequency converter circuits each identical with that shown in FIG. 1 and two constant current sources each identical with that shown in FIG. 3.

The first frequency converter circuit includes transistors Q51 to Q54. The second frequency converter circuit includes transistors Q61 to Q64. The first distortion compensating circuit 60 includes transistors Q55 and Q56 which are connected at emitters through an emitter-coupling resistor R50. The second distortion compensating circuit 70 includes transistors Q65 and Q66 which are connected at emitters through an emitter-coupling resistor R60. The first constant current source includes transistors Q57 and Q58 and resistors R57 and R58. The second constant current source includes transistors Q67 and Q68 and output load resistors R67 and R68. Bias signals are applied from a biasing circuit 200 to bases of the transistors Q57, Q58, Q67, and Q68 through a bias input terminal 57. The RF signals V1 are inputted to input terminals 51 and 52. The Lo signals V2 are inputted to input terminals 53 and 54. The IF signals are outputted from output terminals 55 and 56. The collectors of the transistors Q51, Q53, Q64 and Q62 are connected to the voltage source Vcc through an output load resistor R51. Similarly, the collectors of the transistors Q54, Q52, Q61, and Q63 are connected to the voltage source Vcc through an output load resistor R52. A bias circuit applying a bias to each base of the transistors is, similar to the above embodiments, omitted for the brevity of illustration.

The basic operations of the first and second frequency converter circuits and the first and second distortion compensating circuits are the same as those of the first embodiment. The first and second frequency converter circuits are supplied with the two Lo signals V2 inputted from the input terminals 53 and 54 which are, similar to the RF signals appearing at the input terminals 51 and 52, 180° out of phase with each other. Thus, a composite output (i.e., an IF signal component) from the transistors Q51 and Q53 has the same phase as that of a composite output from the transistors Q62 and Q64, and a composite output from the transistors Q52 and Q54 has the same phase as that of a composite output from the transistors Q61 and Q63. Note that IF signal outputs from the pairs of the transistors Q51 and Q53 and the transistors Q52 and Q54 are in an opposite phase relation to those from the pairs of the transistors Q62 and Q64 and the transistors Q61 and Q63, respectively. Therefore, with the circuit arrangements of this embodiment, RF signal components and Lo signal components are canceled by each other, respectively, so that the IF signals appearing at the output terminals 55 and 56 have signal levels of substantially twice those of the IF signal components outputted from the transistor pairs. Note that the IF signals appearing at the output terminals 55 and 56 are in the opposite phase relation to each other.

While, in this embodiment, the collectors of the differential pair transistors Q51, Q52, Q61, and Q62 are connected to the collectors of the current bypass transistors Q53, Q54, Q63, and Q64, respectively, and the output load resistors R51 and R52 are connected to outputs combining same phase signal components, respectively, the output load resistors R51 and R52 may alternatively be connected to composite signals combining collector outputs from the differential pair transistors Q51 and Q62 and from the differential pair transistors Q52 and Q61 or composite signals combining collectors outputs from the current bypass transistors Q53 and Q54 and from the current bypass transistors Q63 and Q64.

Figure 6:
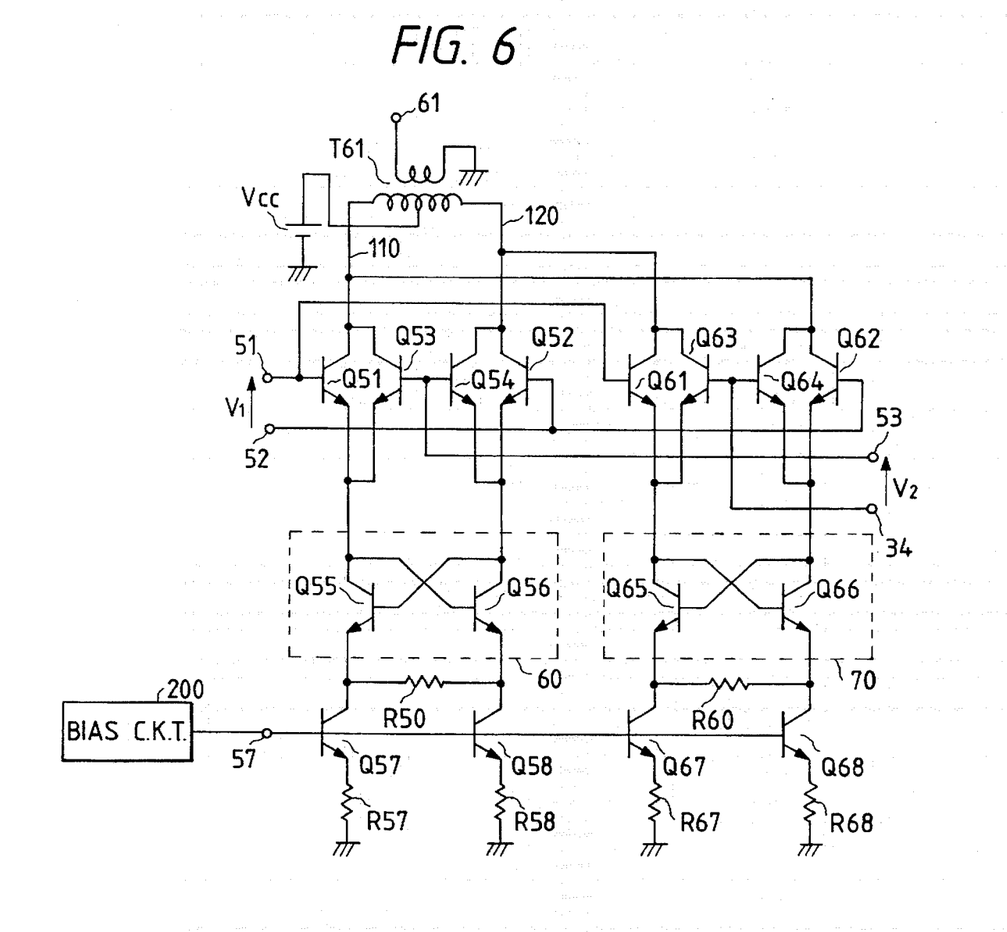
FIG. 6 is a circuit diagram which shows a frequency converter according to the sixth embodiment of the invention.

FIG. 6 shows a sixth embodiment of the frequency converter according to the present invention which is different from the above fifth embodiment in that a transformer T61 which is identical with the transformer T21 of the second embodiment is provided. Other arrangements and operations are the same as those of the fifth embodiment, and explanation thereof in detail will be omitted here.

The transformer T61 serves to mix IF signal components having opposite phases to each other, appearing at signal lines 110 and 120. A composite IF signal appearing at the output terminal 61, thus, has a signal level of twice those of the IF signal components. The RF signal components and the Lo signal components are further canceled and removed from the composite IF signal. Thus, a high conversion gain is obtained.

The transformer T61 may alternatively mix in the reverse phase relation same phase composite signals combining collector outputs from the differential pair transistors Q51 and Q62 and from the differential pair transistors Q52 and Q61 or same phase composite signals combining collector outputs from the current bypass transistors Q53 and Q54 and from the current bypass transistors Q63 and Q64.

Figure 7:
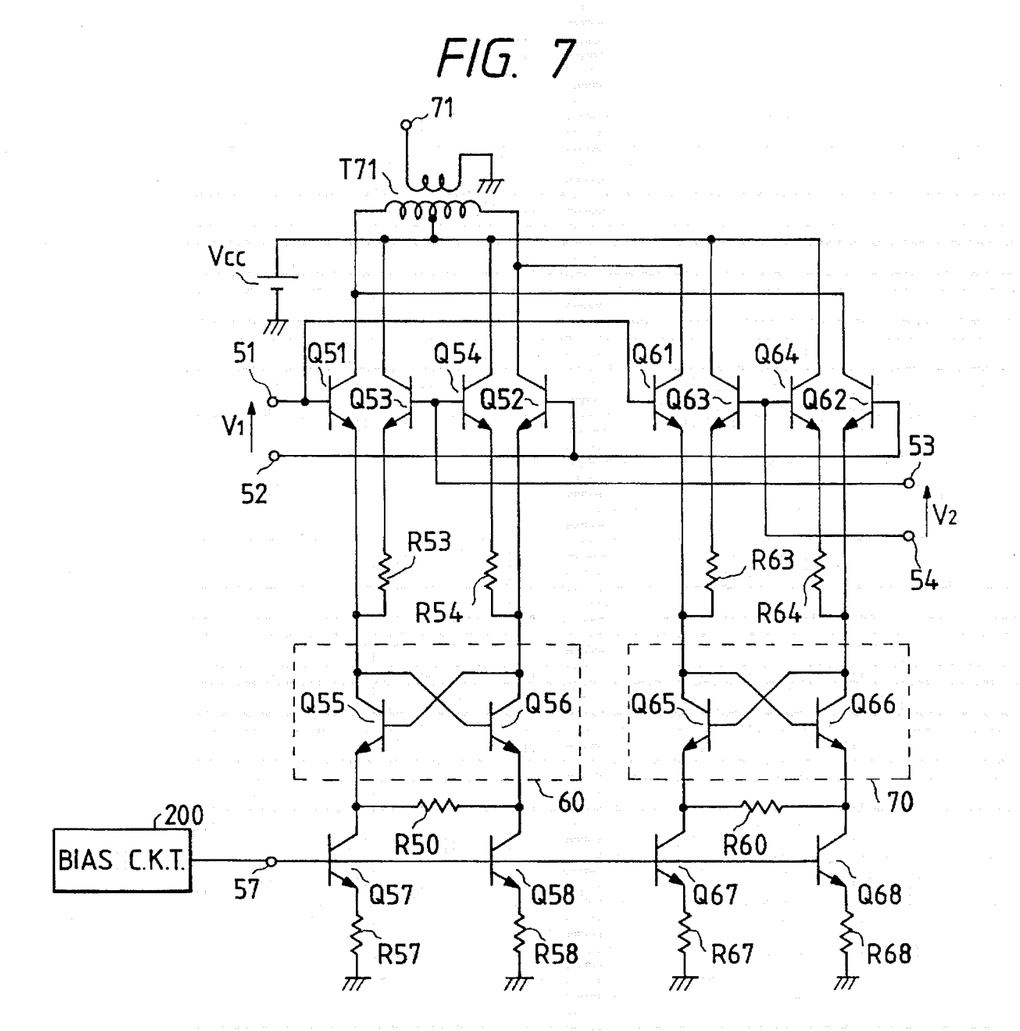
FIG. 7 is a circuit diagram which shows a frequency converter according to the seventh embodiment of the invention.

FIG. 7 shows a seventh embodiment of the frequency converter which is a combination of the third and sixth embodiments.

Specifically, distortion compensation adjusting resistors R53, R54, R63, and R64 are connected to the emitters of the current bypass transistors Q53, Q54, Q63, and Q64. A transformer T71 which is identical with the transformer T31 shown in FIG. 3 is provided to combine in the reverse phase relation same phase composite signals combining collector outputs from the differential pair transistors Q51 and Q62 and from the differential pair transistors Q52 and Q61. Other arrangements and operations are the same as those of the third and sixth embodiments, and explanation thereof in detail will be omitted here.

Instead of the distortion compensation adjusting resistors R53, R54, R63, and R64, it is possible to use as the current bypass transistors Q53, Q54, Q63, and Q64 transistors having emitters smaller in size than the differential pair transistors Q51, Q52, Q61, and Q62.

Figure 8:
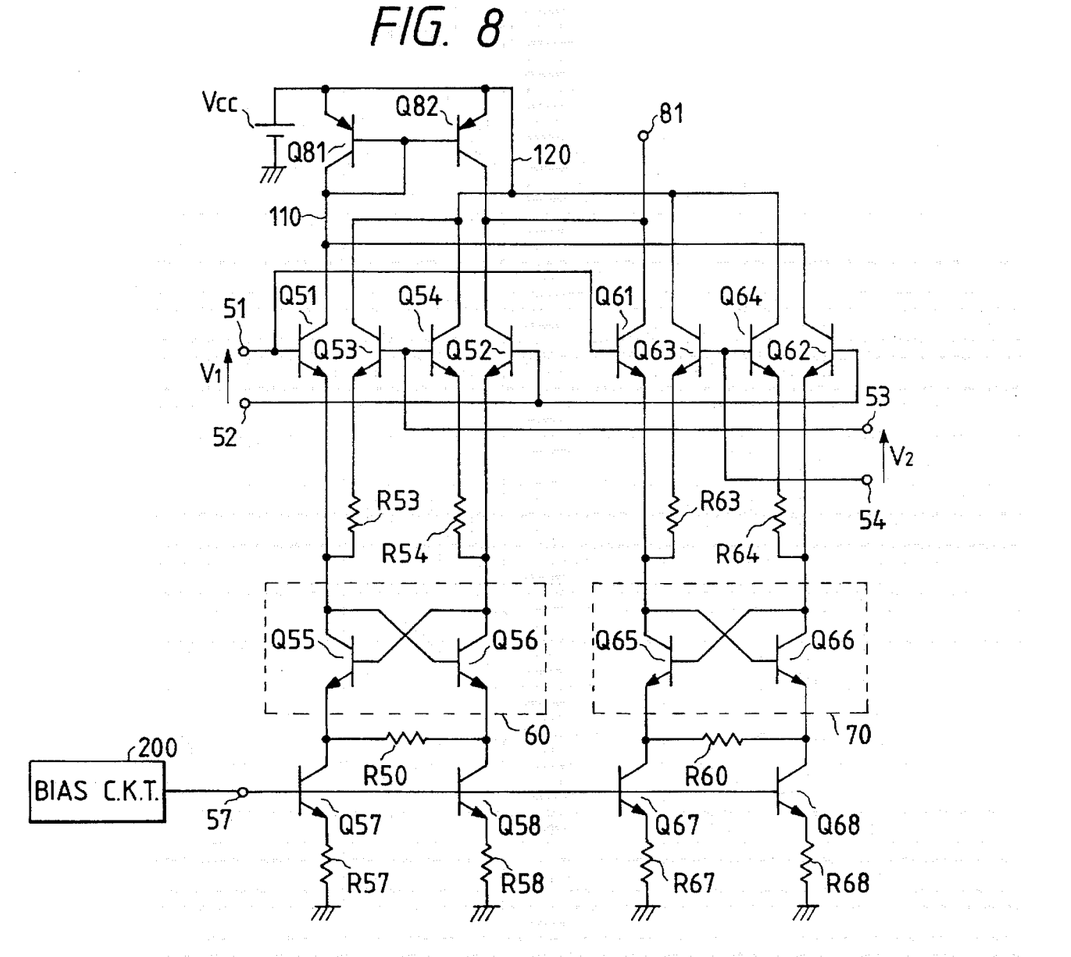
FIG. 8 is a circuit diagram which shows a frequency converter according to the eighth embodiment of the invention.

FIG. 8 shows an eighth embodiment of the frequency converter which is a combination of the fourth and seventh embodiments.

Specifically, an active load circuit including a pair of pnp transistors Q81 and Q82 is provided instead of the transformer T71 of the seventh embodiment. The collector of the pnp transistor Q81 is connected to the collectors of the differential pair transistors Q51 and Q62 through the signal line 110. Similarly, the collector of the pnp transistor Q82 is connected to the collectors of the differential pair transistors Q52 and Q61 and also connected to an IF signal output terminal 81. The active load circuit functionally serves to mix currents flowing through the differential pair transistors Q51, Q52, Q61, and Q62 in the reverse phase relation. The operations of other circuit arrangements are the same as those of the above embodiments, and explanation thereof in detail will be omitted here.

Each of the pnp transistors Q81 and Q82, similar to the fourth embodiment, may alternatively be connected to composite outputs combining same phase components provided from the differential pair transistors and the current bypass transistors, respectively.

Figure 9:
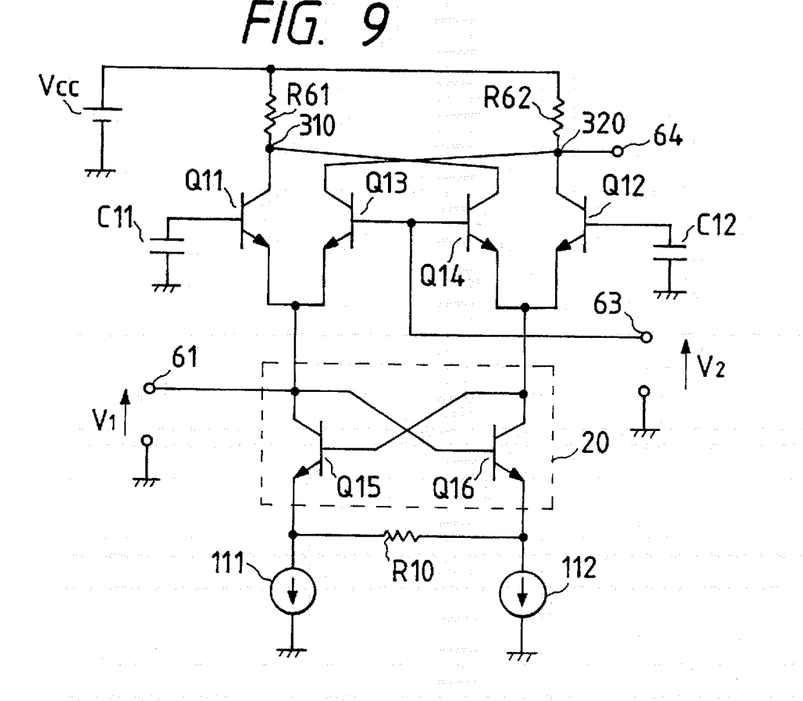
FIG. 9 is a circuit diagram which shows a frequency converter according to the ninth embodiment of the invention.

FIG. 9 shows a ninth embodiment of the frequency converter which is different from the first embodiment in that the single RF signal V1 is inputted to the emitter of the transistor Q11 through an input terminal 61, capacitors C11 and C12 are connected to the bases of the transistors Q11 and Q12, respectively, the transistors Q11 and Q14 and the transistors Q13 and Q12 are connected collector to collector, respectively, and load resistors R61 and R62 are disposed between junctions 310 and 320 of the transistors Q11 and Q14 and the transistors Q13 and Q12 and the voltage source Vcc, respectively. Other arrangements are identical, and explanation thereof in detail will be omitted here.

In operation, the RF signal V1 inputted from the input terminal 61 is combined with the Lo signal V2 inputted from the input terminal 63 so that IF signal components are outputted from the collectors of the transistors Q11 and Q13. The RF signal V1 is also inputted to the emitters of the transistors Q12 and Q14 through the transistor Q16 so that IF signal components are outputted from the collectors of the transistors Q12 and Q14. The IF signal component appearing at the collector of the transistor Q11 assumes the same phase as that of the IF signal component appearing at the collector of the transistor Q14. Similarly, the IF signal component appearing at the collector of the transistor Q13 assumes the same phase as that of the IF signal component appearing at the collector of the transistor Q14, which are 180° out of phase with the IF signal components of the transistors Q11 and Q12 since the phase of the RF signal is reversed through the transistor Q16.

The IF signal mixing collector outputs from the transistors Q12 and Q13 is provided through an IF signal output terminal 64. Three-order intermodulation distortion components appearing at the collectors of the transistors Q12 and Q13 have opposite phases with substantially the same amplitude with the aid of activity of the distortion compensating circuit 20.

Therefore, distortion components of the IF signal components are canceled to provide a desired IF composite signal through the output terminal 64. Further, an input impedance of about 50Ω is provided by inputting the RF signal to the emitter of the transistor Q11, thereby eliminating the need for an input matching circuit.

In this embodiment, the single RF signal is inputted to the emitter of the transistor Q11, but an additional RF signal having an opposite phase to that of the RF signal appearing at the input terminal 61 may also be inputted to the emitter of the transistor Q12 through a junction of the base of the transistor Q15 and the collector of the transistor Q16. An additional Lo signal having an opposite phase to that of the Lo signal inputted into the input terminal 63 may also be applied to the bases of the transistors Q11 and Q12. In this case, it is advisable that the capacitors C11 and C12 be removed and the bases of the transistors Q11 and Q12 be connected to each other. Further, a composite signal mixing collector outputs from the transistors Q11 and Q14 may be combined with a composite signal mixing collector outputs from the transistors Q13 and Q12 into a single composite IF signal to be outputted from the output terminal 64 using, for example, a transformer like the ones as discussed in the above embodiments.

The collectors of the transistors Q11 and Q14 and the collectors of the transistors Q12 and Q13 are connected to each other, respectively, but a load circuit may be provided for each of the transistors Q11 to Q14 without connecting the collectors thereof together. It is also advisable that reactance elements such as inductors or active elements be used instead of the resistors R61 and R62.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims. For example, the frequency converters of the above embodiments are designed to provide difference frequencies; however, they may be designed to provide summation frequencies.

What is claimed is:

1. A frequency converter apparatus comprising:
a differential pair including first and second transistors into which a first signal is inputted to a base of the first and second transistors:
a current bypass circuit including third and fourth transistors, into which a second signal different from said first signal is inputted, bases of the third and fourth transistors being connected to each other, an emitter of the third transistor being connected in series with an emitter of the first transistor, an emitter of the first transistor being connected in series with an emitter of the second transistor wherein the second signal is applied to a base of said third and fourth transistors;
an output load circuit disposed so as to connect a power source to said differential pair and said current bypass circuit;
a distortion compensating circuit including fifth and sixth transistors, a collector of the fifth transistor and a base of the sixth transistor being connected to the emitters of the first and third transistors, a base of the fifth transistor and a collector of the sixth transistor being connected to the emitters of the second and fourth transistors;
a current source circuit connected to emitters of the fifth and sixth transistors; and
a resistor disposed between the emitters of the fifth and sixth transistors wherein said first and second signals are mixed to produce an output signal from said first and second transistors.

2. A frequency converter apparatus as set forth in claim 1, wherein the third and fourth transistors are smaller in size than the first and second transistors.

3. A frequency converter apparatus as set forth in claim 1, further comprising resistors connected to the emitters of the third and fourth transistors, respectively.

4. A frequency converter apparatus as set forth in claim 1, wherein said output load circuit includes a load resistor interposed between said power source and at least one of the collectors of the first, second, third, and fourth transistors, and further comprising a signal output terminal disposed between the load resistor and the at least one of the collectors of the first, second, third, and fourth transistors.

5. A frequency converter apparatus as set forth in claim 1, wherein said output load circuit includes first and second load resistors interposed between said power source and the collectors of the first and third transistors and between said power source and the collectors of the second and fourth transistors, respectively, and further comprising signal output terminals disposed between the first load resistor and the collectors of the first and third transistors and between the second load resistor and the collectors of the second and fourth transistors.

6. A frequency converter apparatus as set forth in claim 1, wherein said output load circuit includes a transformer composed of a primary and a secondary, the primary being supplied with output components of output signals from at least one of said differential pair including the first and second transistors and said current bypass circuit including the third and fourth transistors, having opposite phases to each other and also supplied with power from said power source through a central portion of the primary for providing an output from the secondary.

7. A frequency converter apparatus as set forth in claim 1, wherein said output load circuit includes a transformer composed of a primary and a secondary, the primary being supplied with a composite output mixing collector outputs from the first and third transistors and a composite output mixing collector outputs from the second and fourth transistors and also supplied with power from said power source through a central portion of the primary for providing an output from the secondary.

8. A frequency converter apparatus as set forth in claim 1, wherein said output load circuit includes first and second pnp transistors whose emitters are connected to said power source, a base and a collector of the first pnp transistor being coupled to each other, the base of the first pnp transistor being coupled to a base of the second pnp transistor, the collectors of the first and second pnp transistors being supplied with collector outputs from at least one of said differential pair including the first and second transistors and the current bypass circuit including the third and fourth transistors, and further comprising a signal output terminal connected to a collector of the second pnp transistor.

9. A frequency converter apparatus as set forth in claim 1, wherein said output load circuit includes first and second pnp transistors whose emitters are connected to said power source, a base and a collector of the first pnp transistor being coupled to each other, the base of the first pnp transistor being coupled to a base of the second pnp transistor, the collector of the first pnp transistor being supplied with a composite output mixing collector outputs from the first and third transistors, the collector of the second pnp transistor being supplied with a composite output mixing collector outputs from the second and fourth transistors, and further comprising a signal output terminal connected to the collector of the second pnp transistor.

10. A frequency converter apparatus as set forth in claim 1, wherein said current source circuit includes a seventh transistor and a resistor, the seventh transistor being connected at a base to a current source circuit including a band-gap circuit, at a collector to said distortion compensating circuit, and at an emitter to ground through the resistor of said current source circuit.

11. A frequency converter apparatus comprising:
a differential pair including first and second transistors to which a first signal is inputted to an emitter of at least one of said first and second transistors;
a current bypass circuit including third and fourth transistors, into which a second signal is inputted, bases of the third and fourth transistors being connected to each other and conducted to receive said second signal, an emitter of the third transistor being connected in to an emitter of the first transistor, an emitter of the fourth transistor being connected to an emitter of the second transistor;
an output load circuit disposed so as to connect a power source to said differential pair and said current bypass circuit;
a distortion compensating circuit including fifth and sixth transistors, a collector of the fifth transistor and a base of the sixth transistor being connected to a junction of the emitters of the first and third transistors, a base of the fifth transistor and a collector of the sixth transistor being connected to the emitters of the second and fourth transistors;
a current source circuit connected to emitters of the fifth and sixth transistors; and
a resistor disposed between the emitters of the fifth and sixth transistors wherein said first and second signals are mixed to produce an output signal from said first and second transistors of said differential pair.

12. A frequency converter apparatus as set forth in claim 11, wherein a third signal having an opposite phase to that of the first signal is coupled to the emitter of the second transistor.

13. A frequency converter apparatus as set forth in claim 11, wherein said first input terminal is connected to the emitter of the first transistor and also connected to the emitter of the second transistor through the sixth transistor of the distortion compensating circuit.

14. A frequency converter apparatus as set forth in claim 11, wherein said output load circuit includes first and second load resistors, that first load resistor connecting between the power source and the collectors of the first and fourth transistors, the second load resistor connecting between the power source and the collectors of the second and third transistors, and further comprising an output signal terminal connected to a junction of the collectors of the second and third transistors.

15. A frequency converter apparatus as set forth in claim 14, wherein said output signal terminal is disposed between the second load resistor and the collector of the second transistor.

16. A frequency converter apparatus comprising:

a first frequency converter circuit;

a second frequency converter circuit; and an output load circuit, wherein each of said first and second frequency converter circuits includes
 (1) a differential pair including first and second transistors into which a first signal is inputted on a base of said first and second transistors,
 (2) a current bypass circuit including third and fourth transistors, into which a second signal is inputted, bases of the third and fourth transistors being connected to each other and to receive said second signal, an emitter of the third transistor being connected in series with an emitter of the first transistor, an emitter of the fourth transistor being connected in series with an emitter of the second transistor,
 (3) a distortion compensating circuit including fifth and sixth transistors, a collector of the fifth transistor and a base of the sixth transistor being connected to the emitters of the first and third transistors, a base of the fifth transistor and a collector of the sixth transistor being connected to the emitters of the second and fourth transistors;
 (4) a current source circuit connected to emitters of the fifth and sixth transistors, and
 (5) a resistor disposed between the emitters of the fifth and sixth transistors, wherein said first and second frequency converter circuits are connected so as to mix same phase output signal components of said first and second signals provided thereby, and wherein said output load circuit is disposed so as to connect a power source to said differential pair and said current bypass circuit of each of said first and second frequency converter circuits.

17. A frequency converter apparatus as set forth in claim 16, wherein the third and fourth transistors of at least one of said first and second frequency converter circuits are smaller in size than the first and second transistors of the at least one of said first and second frequency converter circuits.

18. A frequency converter apparatus as set forth in claim 16, further comprising resistors connected to the emitters of the third and fourth transistors of each of said first and second frequency converter circuits, respectively.

* * * * *